(12) United States Patent
Liu

(10) Patent No.: US 11,431,337 B2
(45) Date of Patent: Aug. 30, 2022

(54) SWITCH CIRCUIT

(71) Applicant: REALTEK SEMICONDUCTOR CORP., Hsinchu (TW)

(72) Inventor: Tsung-Yen Liu, Hsinchu (TW)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 17/187,445

(22) Filed: Feb. 26, 2021

(65) Prior Publication Data

US 2022/0116035 A1 Apr. 14, 2022

(30) Foreign Application Priority Data

Oct. 13, 2020 (TW) ................................ 109135401

(51) Int. Cl.
| | |
|---|---|
| *H03K 17/00* | (2006.01) |
| *H03K 17/687* | (2006.01) |
| *H03K 3/037* | (2006.01) |
| *H03K 17/06* | (2006.01) |
| *H03K 17/16* | (2006.01) |

(52) U.S. Cl.
CPC ......... *H03K 17/6872* (2013.01); *H03K 3/037* (2013.01); *H03K 17/063* (2013.01); *H03K 17/161* (2013.01); *H03K 17/164* (2013.01); *H03K 17/687* (2013.01); *H03K 17/6871* (2013.01); *H03K 2217/0054* (2013.01)

(58) Field of Classification Search
None
See application file for complete search history.

(56) References Cited

U.S. PATENT DOCUMENTS

| 4,595,847 | A | | 6/1986 | Weir | |
|---|---|---|---|---|---|
| 5,880,620 | A | * | 3/1999 | Gitlin | ................... H03K 17/063 |
| | | | | | 327/534 |
| 6,046,622 | A | | 4/2000 | Miles | |
| 6,097,238 | A | * | 8/2000 | Zhou | ................... H03K 17/6872 |
| | | | | | 327/390 |
| 6,100,719 | A | * | 8/2000 | Graves | ................. H03K 17/063 |
| | | | | | 326/21 |
| 7,038,525 | B2 | | 5/2006 | Kato | |
| 9,007,101 | B2 | | 4/2015 | Zeng | |
| 9,966,940 | B2 | | 5/2018 | Rotem et al. | |

(Continued)

FOREIGN PATENT DOCUMENTS

| TW | I339498 B | 3/2011 |
|---|---|---|
| WO | WO 97/24807 A1 | 7/1997 |

*Primary Examiner* — Tuan T Lam
(74) *Attorney, Agent, or Firm* — Birch, Stewart, Kolasch & Birch, LLP

(57) ABSTRACT

A switch circuit is provided. The switch circuit includes a P-type transistor switch and a first P-type control transistor. The P-type transistor switch includes a first control end, a first output end, and a first input end. The first input end receives a first input signal whose logic level is one. The first P-type control transistor is coupled to the first input end and the first control end. The first P-type control transistor includes a second control end. The second control end receives a second input signal whose logic level is zero to turn on the first P-type control transistor. When the first P-type control transistor is turned on, the first input signal is transmitted to the first control end of the P-type transistor switch to turn off the P-type transistor switch.

8 Claims, 2 Drawing Sheets

(56) References Cited

U.S. PATENT DOCUMENTS

| | | | |
|---|---|---|---|
| 10,454,475 B2 | 10/2019 | Takemura et al. | |
| 2006/0028262 A1* | 2/2006 | Grimone | H03K 17/162 327/427 |
| 2008/0266739 A1* | 10/2008 | Migliavacca | G05F 1/571 361/91.1 |
| 2010/0321090 A1 | 12/2010 | Blair | |
| 2011/0156794 A1* | 6/2011 | Guo | H03K 17/04123 327/419 |
| 2013/0321063 A1* | 12/2013 | Cozzolino | H03K 17/693 327/437 |
| 2016/0194024 A1* | 7/2016 | Kikuchi | F16H 55/22 180/444 |
| 2018/0026630 A1* | 1/2018 | Roig-Guitart | H03K 17/165 327/108 |
| 2019/0068183 A1* | 2/2019 | Lu | H03K 17/162 |

* cited by examiner

SWITCH CIRCUIT

CROSS-REFERENCE TO RELATED APPLICATION

This non-provisional application claims priority under 35 U.S.C. § 119(a) to Patent Application No. 109135401 filed in Taiwan, R.O.C. on Oct. 13, 2020, the entire contents of which are hereby incorporated by reference.

BACKGROUND

Technical Field

The present disclosure relates to a switch circuit.

Related Art

A metal oxide semiconductor (MOS) is a transistor that can be widely used in analog circuits and digital circuits. Metal oxide semiconductors may be divided into an N-channel type with electron predominance and a P-channel type with hole predominance according to channel polarities, which are generally referred to as an N-type metal oxide semiconductor (NMOS) and a P-type metal oxide semiconductor (PMOS) respectively. Both the NMOS and the PMOS can receive, through a gate, an input signal whose logic level is zero or one for controlling turn-on or turn-off of the NMOS and the PMOS. The gate of the NMOS is turned on according to a received input signal whose logic level is one, and is turned off according to a received input signal whose logic level is zero. The gate of the PMOS is turned on according to a received input signal whose logic level is zero, and is turned off according to a received input signal whose logic level is one.

When the switch circuit is provided with a PMOS and a power source of the switch circuit is turned off, based on characteristics of the PMOS, the PMOS is turned on when the gate of the PMOS has a logic level of zero, and the PMOS cannot be completely turned off. As a result, a parasitic circuit leakage and a PMOS leakage are caused. A leakage current may leak from a source of the PMOS to a base (body) or a drain of the PMOS.

SUMMARY

In some embodiments, a switch circuit includes a P-type transistor switch and a first P-type control transistor. The P-type transistor switch includes a first control end, a first output end, and a first input end. The first input end receives a first input signal whose logic level is one. The first P-type control transistor is coupled to the first input end and the first control end. The first P-type control transistor includes a second control end. The second control end receives a second input signal whose logic level is zero to turn on the first P-type control transistor. When the first P-type control transistor is turned on, the first input signal is transmitted to the first control end of the P-type transistor switch to turn off the P-type transistor switch.

DETAILED DESCRIPTION

Figure 1:
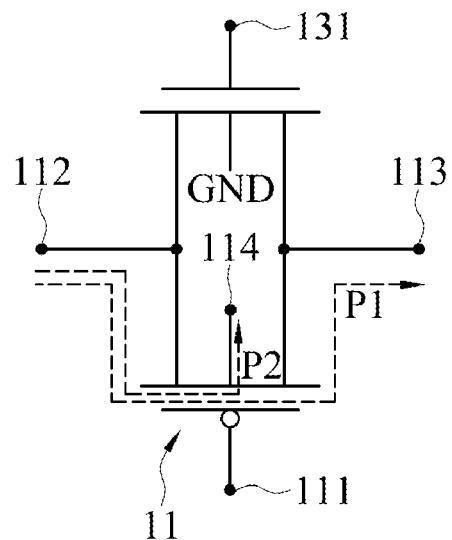
FIG. 1 is a schematic circuit diagram of an embodiment of a switch circuit according to the present disclosure.

Referring to FIG. 1, FIG. 1 is a schematic circuit diagram of an embodiment of a switch circuit according to the present disclosure. The switch circuit includes a P-type metal oxide semiconductor field-effect transistor (PMOS) as one of switches in the switch circuit, which is referred to as a P-type transistor switch 11 below. The P-type transistor switch 11 includes a control end (which is referred to as a first control end 111 below for ease of description), an input end (which is referred to as a first input end 112 below), and an output end (which is referred to as a first output end 113 below). The first control end 111 is a gate of the P-type transistor switch 11, the first input end 112 may be a source of the P-type transistor switch 11, and the first output end 113 may be a drain of the P-type transistor switch 11. The P-type transistor switch 11 may be controlled, according to a logic level of a control signal received by the first control end 111 being zero or one, to be turned on or off. When the logic level of the control signal received by the first control end 111 is zero, the P-type transistor switch 11 may be turned on, and the P-type transistor switch 11 transmits an input signal received by the first input end 112. The input signal may be transmitted from the first input end 112 to the first output end 113. When the logic level of the input signal received by the first control end 111 is one, the P-type transistor switch 11 may be turned off. When a power source of the switch circuit is turned off, the logic level at the first control end 111 is zero. In this case, since the P-type transistor switch 11 is turned on, a current outside the switch circuit may leak from the first input end 112 to the first output end 113 according to a path P1 shown in FIG. 1, or leak from the first input end 112 to a base (body) 114 of the P-type transistor switch 11 according to a path P2.

Figure 2:
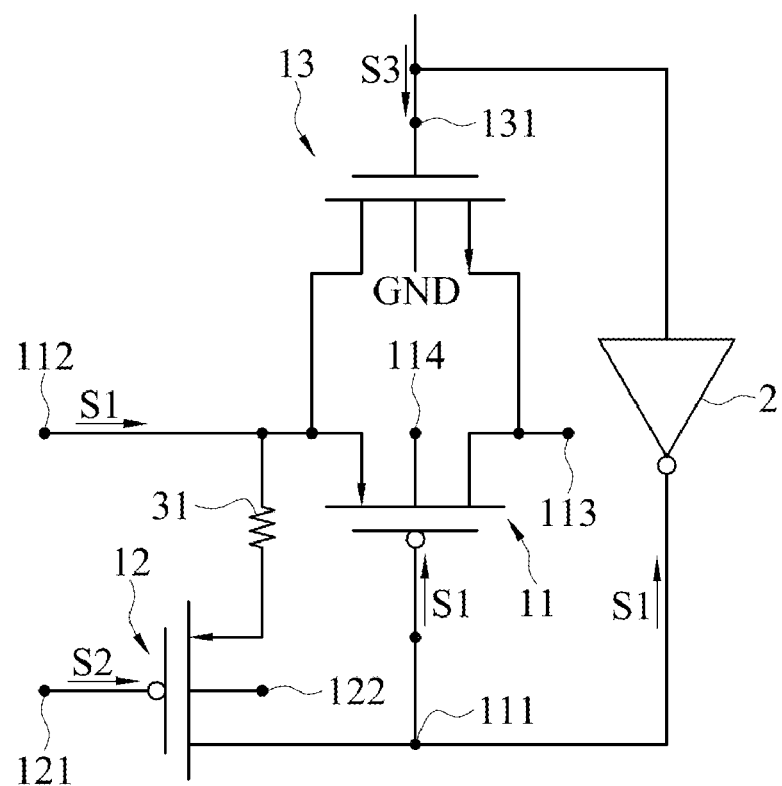
FIG. 2 is a schematic circuit diagram of another embodiment of the switch circuit according to the present disclosure.

In order avoid the above leakage, referring to FIG. 2, FIG. 2 is a schematic circuit diagram of another embodiment of a switch circuit according to the present disclosure. The switch circuit includes a P-type transistor switch 11 and a P-type control transistor (which is referred to as a first P-type control transistor 12 below) as shown in FIG. 1. The first P-type control transistor 12 is coupled between the first input end 112 and the first control end 111 of the P-type transistor switch 11, that is, a source of the first P-type control transistor 12 is coupled to the first input end 112, and a drain of the first P-type control transistor 12 is coupled to the first control end 111. The first P-type control transistor 12 further includes a control end (which is referred to as a second control end 121). The second control end 121 is a gate of the first P-type control transistor 12.

When the power source of the switch circuit is turned off, the first input end 112 of the P-type transistor switch 11 receives a first input signal S1 whose logic level is one. The first input signal S1 is a current signal for the above leakage. The second control end 121 of the first P-type control transistor 12 receives an input signal whose logic level is zero (which is referred to as a second input signal S2 below), so that the first P-type control transistor 12 is turned on according to the second input signal S2. When the first P-type control transistor 12 is turned on, the first input signal S1 whose logic level is one is received at the first input end 112. The first input signal S1 is transmitted to the first control end 111 of the P-type transistor switch 11 through the first P-type control transistor 12. In other words, the first control end 111 receives the first input signal S1 whose logic level is one, so that the P-type transistor switch 11 is turned off according to the logic level of the first input signal S1. In this way, the first input signal S1 whose logic level is one received at the first input end 112 is prevented from being transmitted to the first output end 113 through the P-type transistor switch 11.

Based on this, the first P-type control transistor 12 is disposed in the switch circuit to be coupled to the P-type transistor switch 11, and the first P-type control transistor 12 is controlled to be turned on, so that the first input signal S1 whose logic level is one is transmitted to the P-type transistor switch 11 to turn off the P-type transistor switch 11, which can eliminate leakage generated when the power source of the switch circuit is turned off. Therefore, when the first input end 112 of the P-type transistor switch 11 receives the first input signal S1 that is a leakage current signal, the first input signal S1 may be completely prevented from being transmitted to the first output end 113 according to a fact that the P-type transistor switch 11 is turned off, thereby ensuring that the P-type transistor switch 11 is indeed turned off when the power source of the switch circuit is turned off.

In some embodiments, the switch circuit further includes an N-type transistor switch 13. The N-type transistor switch 13 is coupled between the first input end 112 and the first output end 113 of the P-type transistor switch 11. In other words, a drain of the transistor switch 13 is coupled to the first input end 112, and a source of the N-type transistor switch 13 is coupled to the first control end 111. The N-type transistor switch 13 further includes a control end (which is referred to as a third control end 131), and the third control end 131 receives an inverted input signal S3. A logic level of the inverted input signal S3 and a logic level of the first input signal S1 are inverted relative to each other, that is, when the logic level of the first input signal S1 is one, the logic level of the inverted input signal S3 is zero, and the N-type transistor switch 13 and the P-type transistor switch 11 are both turned off. When the logic level of the first input signal S1 is zero, the logic level of the inverted input signal S3 is one, and the N-type transistor switch 13 and the P-type transistor switch 11 are turned on. Therefore, the N-type transistor switch 13 and the P-type transistor switch 11 may jointly form a set of complementary metal oxide field effect transistor (complementary MOS) switches.

Figure 3:
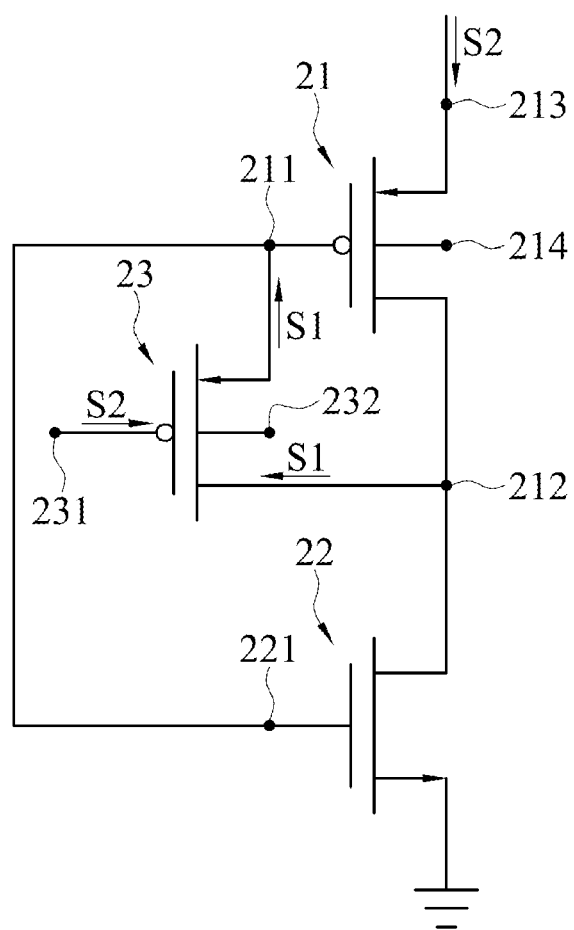
FIG. 3 is a schematic circuit diagram of an embodiment of an inverter of the switch circuit according to FIG. 1.

In some embodiments, the switch circuit further includes an inverter 2. The inverter 2 is configured to control elements of the P-type transistor switch 11 and the N-type transistor switch 13. Referring to both FIG. 2 and FIG. 3, FIG. 3 is a schematic circuit diagram of an embodiment of an inverter 2 of the switch circuit according to FIG. 1. The inverter 2 is coupled between the third control end 131 of the N-type transistor switch 13 and the first control end 111 of the P-type transistor switch 11. The inverter 2 includes a P-type transistor 21 and an N-type transistor 22. The P-type transistor 21 includes a fourth control end 211, a second input end 213, and a second output end 212. The fourth control end 211 is a gate of the P-type transistor 21, the second input end 213 may be a source of the P-type transistor 21, and the second output end 212 may be a drain of the P-type transistor 21. The N-type transistor 22 includes a sixth control end 221. The sixth control end 221 may be a gate of the N-type transistor 22. The N-type transistor 22 is connected in series to the P-type transistor 21, and a drain of the N-type transistor 22 is coupled to the second output end 212 of the P-type transistor 21. The second output end 212 is coupled to the first control end 111 of the P-type transistor switch 11, that is, the first control end 111 is coupled between the P-type transistor 21 and the N-type transistor 22. The fourth control end 211 of the P-type transistor 21 and the sixth control end 221 of the N-type transistor 22 are coupled to each other, and the fourth control end 211 and the N-type transistor 22 are jointly coupled to the third control end 131 of the N-type transistor switch 13, that is, the third control end 131 is coupled between the fourth control end 211 and the sixth control end 221.

In some embodiments, the switch circuit further includes another P-type control transistor (which is referred to as a second P-type control transistor 23 below). The second P-type control transistor 23 is coupled between the fourth control end 211 and the second output end 212 of the P-type transistor 21. The second P-type control transistor 23 further includes a control end (which is referred to as a fifth control end 231). When the power source of the switch circuit is turned off, the second input end 213 of the P-type transistor 21 receives a second input signal S2 with the same logic level of zero as the second control end 121. In addition, since the first control end 111 and the second output end 212 are coupled to each other, the second output end 212 of the P-type transistor 21 receives the above first input signal S1 that is the leakage current signal. In other words, the first input signal S1 is received at the first input end 112 of the P-type transistor switch 11, and the first input signal S1 is transmitted to the second output end 212 through the first P-type control transistor 12 and the first control end 111, so that the second output end 212 receives the first input signal S1.

The fifth control end 231 of the second P-type control transistor 23 receives the second input signal S2 with the same logic level of zero as the second control end 121, so that the second P-type control transistor 23 is turned on according to the second input signal S2. When the second P-type control transistor 23 is turned on, the first input signal S1 whose logic level is one received at the second output end 212 of the P-type transistor 21 is transmitted to the fourth control end 211 of the P-type transistor 21 through the second P-type control transistor 23. In other words, the fourth control end 211 receives the first input signal S1 whose logic level is one, so that the P-type transistor 21 is turned off according to the logic level of the first input signal S1, thereby preventing the first input signal S1 whose logic level is one received at the second output end 212 from being transmitted to the second input end 213 through the P-type transistor 21.

In some embodiments, the switch circuit further includes a resistor 31. The resistor 31 protects the switch circuit. The resistor 31 is coupled between the P-type transistor switch 11 and the first P-type control transistor 12. In other words, one end of the resistor 31 is coupled to the first input end 112 of the P-type transistor switch 11, and the other end of the resistor 31 is coupled to the source of the first P-type control transistor 12.

In some embodiments, when the power source of the switch circuit is turned off, in order to prevent the P-type transistor switch 11 from being turned on as a result of the logic level of the first control end 111 of the P-type transistor switch 11 being zero, which causes the first input signal S1 whose logic level is one to be leaked from the first input end 112 to a base 114 of the P-type transistor switch 11 according to a path P2 shown in FIG. 1, the base 114 of the P-type transistor switch 11 may be set to be floating, so that the logic level of the base 114 is not zero. In addition, similarly, a base 122 of the first P-type control transistor 12, a base 214 of the P-type transistor 21, and a base 232 of the second P-type control transistor 23 may be set to be floating to prevent the first input signal S1 whose logic level is one from leaking to the bases 122, 214, and 232 of the first P-type control transistor 12, the P-type transistor 21, and the second P-type control transistor 23 respectively as a result of turn-on of the first P-type control transistor 12, the P-type transistor 21, and the second P-type control transistor 23.

In some embodiments, the switch circuit is implemented by a chip, and an input end of the chip is coupled to an external circuit of the chip. The first input end 112, the second input end 213, the second control end 121, and the fifth control end 231 are the input end of the chip. The first input signal S1 received at the first input end 112 is from the external circuit of the chip, and the second input signals S2 received at the second input end 213, the second control end 121, and the fifth control end 231 are also from the external circuit of the chip. In addition, the second output end 212 and the control ends 111, 131, 211, and 221 are located on the internal circuit of the chip, and a user cannot directly set logic levels of the input signals S1 and S2 received at the second output end 212 and the control ends 111, 131, 211, and 221. Therefore, in order to completely turn off the P-type transistor switch 11 and the P-type transistor 21 to prevent the first input signal S1, which is a leakage current, from the external circuit from leaking from the first input end 112 of the P-type transistor switch 11 to the base 114 of the first output end 113 and to prevent the first input signal S1 from leaking from the second output end 212 of the P-type transistor 21 to the second input end 213 and the base 214, the switch circuit may transmit, through the first P-type control transistor 12, the first input signal S1 to the first control end 111 by using the second input signal S2 in the external circuit of the chip set to zero by the user and the first input signal S1 received at the first input end 112, to completely turn off the P-type transistor switch 11. In addition, the first input signal S1 is transmitted to the fourth control end 211 through the first P-type control transistor 12, the first control end 111, the second output end 212, and the second P-type control transistor 23 to completely turn off the P-type transistor 21.

In summary, the P-type control transistor is disposed to be coupled to the P-type transistor switch and the P-type transistor of the switch circuit, and the P-type control transistor is controlled to be turned on to transmit the input signal whose logic level is one to the P-type transistor switch and the P-type transistor, to turn off the P-type transistor switch and the P-type transistor, so that a path of leakage from the input ends of the P-type transistor switch and the P-type transistor to the output end formed when the power source of the switch circuit is turned off and a path of leakage from the input end to bases of the P-type transistor switch and the P-type transistor can be blocked, thereby eliminating the leakage generated when the power source of the switch circuit is turned off. In this way, when the input ends of the P-type transistor switch and the P-type transistor receive the input signal that is a leakage current signal, it can be ensured that the P-type transistor switch is indeed turned off, thereby completely preventing the input signal from being transmitted to the base and the output end of the P-type transistor switch.

Although the present disclosure has been described in considerable detail with reference to certain preferred embodiments thereof, the disclosure is not for limiting the scope of the disclosure. Persons having ordinary skill in the art may make various modifications and changes without departing from the scope and spirit of the disclosure. Therefore, the scope of the appended claims should not be limited to the description of the preferred embodiments described above.

What is claimed is:

1. A switch circuit, comprising:
   a P-type transistor switch comprising:
      a first control end;
      a first output end;
      a first input end configured to receive a first input signal whose logic level is one; and
      a first P-type control transistor coupled to the first input end and the first control end comprising:
         a second control end configured to receive a second input signal whose logic level is zero to turn on the first P-type control transistor, wherein when the first P-type control transistor is turned on, the first input signal is transmitted to the first control end of the P-type transistor switch to turn off the P-type transistor switch, wherein a base of the P-type transistor switch is floating; and
   an N-type transistor switch coupled to the first input end and the first output end comprising:
      a third control end configured to receive a first inverted input signal, wherein the first inverted input signal and the first input signal are inverted relative to each other.

2. The switch circuit according to claim 1, wherein the switch circuit is implemented by a chip, the first control end and the third control end are located inside the chip, the first input end and the second control end are input ends of the chip, and the first input signal and the second input signal are from an external circuit coupled to the chip.

3. The switch circuit according to claim 1, further comprising:
   an inverter coupled to the third control end and the first control end comprising:
      a P-type transistor comprising:
         a second input end configured to receive the second input signal;
         a fourth control end coupled to the third control end; and
         a second output end coupled to the first control end to transmit the first input signal from the first control end to the second output end; and
      an N-type transistor coupled to the second output end; and
      a second P-type control transistor coupled to the fourth control end and the second output end comprising:
         a fifth control end configured to receive the second input signal whose logic level is zero to turn on the second P-type control transistor, wherein when the second P-type control transistor is turned on, the first input signal is transmitted to the fourth control end of the P-type transistor to turn off the P-type transistor.

4. The switch circuit according to claim 3, wherein the switch circuit is implemented by a chip, the first control end and the third control end are located inside the chip, the first input end, the second input end, the second control end, and the fifth control end are input ends of the chip, and the first input signal and the second input signal are from an external circuit coupled to the chip.

5. The switch circuit according to claim 1, further comprising a resistor, wherein the resistor is coupled to the N-type transistor switch and the first input end.

6. The switch circuit according to claim 1, wherein a base of the first P-type control transistor is floating.

7. The switch circuit according to claim 3, wherein a base of the P-type transistor is floating.

8. The switch circuit according to claim 3, wherein a base of the second P-type control transistor is floating.

* * * * *